(12) United States Patent
Venkatraman et al.

(10) Patent No.: US 8,518,553 B2
(45) Date of Patent: Aug. 27, 2013

(54) LAYERED STRUCTURE

(75) Inventors: Chandra Venkatraman, Williamsville, NY (US); Keith Majeroni, Raleigh, NC (US); Daniel Kester, Williamsville, NY (US)

(73) Assignee: Sulzer Metaplas GmbH, Bergisch Gladbach (DE)

( * ) Notice: Subject to any disclaimer, the term of this patent is extended or adjusted under 35 U.S.C. 154(b) by 438 days.

(21) Appl. No.: 10/581,188

(22) PCT Filed: Nov. 30, 2004

(86) PCT No.: PCT/EP2004/013676
§ 371 (c)(1),
(2), (4) Date: Oct. 4, 2007

(87) PCT Pub. No.: WO2005/054540
PCT Pub. Date: Jun. 16, 2005

(65) Prior Publication Data
US 2008/0166287 A1    Jul. 10, 2008

Related U.S. Application Data

(63) Continuation-in-part of application No. PCT/EP03/50923, filed on Dec. 2, 2003.

(51) Int. Cl.
*B22F 3/00* (2006.01)

(52) U.S. Cl.
USPC .............. 428/552; 428/9; 428/698; 423/446; 427/402

(58) Field of Classification Search
USPC ........... 423/446; 427/402; 428/552, 688, 428/699, 336, 408, 446, 698, 469, 472, 621, 428/627, 634, 632, 660
See application file for complete search history.

(56) References Cited

U.S. PATENT DOCUMENTS

| | | | |
|---|---|---|---|
| 5,466,431 A | 11/1995 | Dorfman et al. | |
| 5,718,976 A * | 2/1998 | Dorfman et al. | 428/408 |
| 5,795,648 A | 8/1998 | Goel et al. | |
| 6,200,675 B1 | 3/2001 | Neerinck et al. | |
| 6,228,471 B1 * | 5/2001 | Neerinck et al. | 428/216 |
| 6,562,445 B2 | 5/2003 | Iwamura | |
| 6,821,497 B2 * | 11/2004 | Moronuki | 423/415.1 |
| 7,255,084 B2 * | 8/2007 | Savale et al. | 123/193.6 |
| 7,988,786 B2 | 8/2011 | Sato et al. | |
| 2003/0087096 A1 | 5/2003 | Sato et al. | |

FOREIGN PATENT DOCUMENTS

| | | |
|---|---|---|
| EP | 0 856 592 A1 | 8/1998 |
| EP | 0 861 922 A1 | 9/1998 |
| JP | 7-62541 A | 3/1995 |
| JP | 10-130865 * | 5/1998 |
| JP | 11-512634 A | 11/1999 |
| JP | 2000-119843 A | 4/2000 |
| JP | 2000-508713 A | 7/2000 |
| JP | 2001-509841 A | 7/2001 |
| JP | 2001-261318 A | 9/2001 |
| JP | 2003-501555 A | 1/2003 |
| JP | 2003-231203 A | 8/2003 |
| WO | WO 98/33948 A1 | 8/1998 |
| WO | WO 00/75394 A1 | 12/2000 |

* cited by examiner

*Primary Examiner* — Stuart Hendrickson
*Assistant Examiner* — Richard M Rump
(74) *Attorney, Agent, or Firm* — Foley & Lardner LLP

(57) ABSTRACT

The invention relates to a layered structure comprising
  a first intermediate layer, said first intermediate layer comprising at least one element of group IVB, group VB or group VIB;
  a second intermediate layer deposited on top of said first intermediate layer, said second intermediate layer comprising a diamond-like nanocomposite composition;
  a diamond-like carbon layer deposited on top of said second intermediate layer.

The invention further relates to the use of a substrate coated with such a layered structure for high shear and/or high impact applications and to a method to cover a substrate with such a layered structure.

14 Claims, No Drawings

LAYERED STRUCTURE

FIELD OF THE INVENTION

The invention relates to a layered structure comprising a first intermediate layer comprising at least one element of group IVB, VB or IVB, a second intermediate layer comprising a diamond-like nanocomposite composition and a diamond-like carbon layer.

The invention further relates to a substrate covered at least partially with such a layered structure and to a method to cover a substrate with such a layered structure.

BACKGROUND OF THE INVENTION

It is generally known to coat substrates with a diamond-like carbon coating (DLC). DLC coatings are amorphous hydrogenated carbon films (a-C:H) characterised by a high hardness, a low coefficient of friction and excellent wear resistance.

However, because of the high compressive residual stresses in the coating, the adhesion of DLC coatings to the substrate is often too poor. This is an important drawback of DLC coatings, limiting the use of DLC coatings for certain applications.

Many attempts have been made to improve the adhesion of a DLC coating to the substrate for example by using an intermediate layer between the substrate and the DLC coating. An example of such an attempt comprises the use of a diamond-like nanocomposite (DLN) layer as intermediate layer between the substrate and the DLC layer as described in WO 98/33948.

Diamond-like nanocomposite coatings comprise C, H, O and Si. Generally, DLN coatings comprise two interpenetrating networks a-C:H and a-S:O. DLN coatings are commercially known as DYLYN® coatings (Diamond-Like Nanocomposite Coatings).

Also the use of a titanium or a titanium-based intermediate layer between the substrate and a DLC layer is known in the art to improve the adhesion of a DLC coating to a substrate.

For this type of layered structures a gradual change from a titanium or titanium-based layer to a DLC layer is required.

Therefore, first a titanium or a titanium-based layer is deposited on a substrate by means of a PVD process, subsequently DLC is deposited on the titanium or titanium-based layer. The composition of the titanium or titanium-based layer is thereby gradually changed from a titanium or titanium-based layer to a DLC layer.

However, a serious problem of the use of titanium or titanium-based interlayers is the target poisoning of the titanium target. Because of this target poisoning, the transition between the titanium or titanium-based layer and the DLC layer is not reproducible.

Another disadvantage of the application of a layered structure of a titanium or titanium-based layer and a DLC coating is the poor corrosion protection that is obtained.

This is the consequence of the bad surface coverage (line-of-sight locations) on for example the backside surfaces of a substrate to be coated. These surfaces are not exposed to the beam of titanium atoms.

SUMMARY OF THE INVENTION

It is an object of the present invention to provide a layered structure comprising a DLC coating having an improved adhesion to a substrate.

It is another object of the invention to provide a layered structure that may withstand a high load and that is thus suitable for high impact and high shear applications.

It is a further object to provide a substrate covered with a structure having an improved surface coverage.

According to a first aspect of the invention, a layered structure is provided.

The layered structure according to the present invention comprises
- a first intermediate layer, comprising at least one element of group IVB, VB or VIB;
- a second intermediate layer deposited on the first intermediate layer, the second intermediate layer comprising a diamond-like nanocomposite composition;
- a diamond-like carbon layer, deposited on said second intermediate layer.

The First Intermediate Layer

The first intermediate layer comprises at least one element of the group IVB, VB or VIb.

Preferably, the first intermediate layer comprises titanium and/or chromium as for example a titanium layer, a chromium layer, a titanium-based layer or a chromium-based layer.

A titanium-based layer may for example comprise a TiC layer, a TiN layer or a TiCN layer. A chromium-based layer may for example comprise a CrN layer or a $Cr_3C_2$ layer.

For many applications a titanium-based layer is preferred to a chromium-base layer as it is easier to rework or refurbish layered structures comprising a titanium-based layer.

For example, a reactive ion etching used to decoat will not work with a chromium-based interlayer.

The thickness of the first intermediate layer is preferably between 0.001 and 1 µm. More preferably, the thickness of the first intermediate layer is between 0.1 and 0.5 µm.

The first intermediate layer may be deposited by any technique known in the art. Preferred techniques comprises physical vapor deposition techniques as sputtering or evaporating.

The Second Intermediate Layer

The second intermediate layer comprises a diamond-like nanocomposite composition.

A diamond-like nanocomposite composition comprises an amorphous structure of C, H, Si and O.

Preferably, the nanocomposite composition comprises in proportion to the sum of C, Si, and O: 40 to 90% C, 5 to 40% Si, and 5 to 25% O (expressed in at %).

Preferably, the diamond-like nanocomposite composition comprises two interpenetrating networks of a-C:H and a-Si:O.

The diamond-like nanocomposite coating may further be doped with a metal, such as a transition metal of Group IV to VII. The coating can be doped to influence the conductivity of the coating. W, Zr and Ti are for example well suited as doping element.

The second intermediate layer has a thickness which is preferably between 0.01 and 5 µm. More preferably, the thickness is between 0.1 and 1 µm, for example between 0.2 and 0.5 µm.

The second intermediate layer may be deposited by any technique known in the art. A preferred technique comprises chemical vapor deposition (CVD), such as plasma assisted chemical vapor deposition (PACVD).

Diamond-Like Carbon Coating

The diamond-like carbon coating comprises amorphous hydrogenated carbon (a-C:H).

Preferably, a diamond-like carbon coating comprises a mixture of $sp^2$ and $sp^3$ bonded carbon with a hydrogen concentration between 0 and 60 at %.

The DLC coating may be metal doped, for example to influence the electrical conductivity of the coating. Preferred doping elements are transition metals of Group IV to VII such as W, Zr and Ti.

The thickness of the DLC coating is preferably between 0.1 and 10 µm.

The DLC coating may be deposited by any technique known in the art.

A preferred technique comprises chemical vapor deposition (CVD), such as plasma assisted chemical vapor deposition (PACVD).

Although the applicant does not want to be bound to any theory, it is believed that the gradation of the hardness of the layers is important to obtain the good results of a layered structure according to the present invention.

In the case a titanium layer is used as intermediate layer for a DLC coating, there is a soft substrate with a layer of soft Ti. DLC deposited on such a stack is prone to puncturing.

In the layered structure according to the present invention comprising a first intermediate layer and a second intermediate layer comprising DLN, the second intermediate layer provides extra support. Furthermore, the second intermediate layer, having a hardness in between the hardness of the first intermediate layer and the hardness of the DLC coating, provides a cushioning effect.

Possibly, the layered structure according to the present invention further comprises one or more additional layers as for example a layer comprising a diamond-like nanocomposite composition on top of the diamond-like carbon layer.

In another embodiment, the layered structure further comprises a diamond-like nanocomposite layer on top of the diamond-like carbon layer and a diamond-like carbon layer on top of the diamond-like nanocomposite layer.

It is clear for a person skilled in the art that the number of the additional layers can be varied according to the desired properties of the layered structure.

The top layer of the layered structure can be chosen depending on the desired properties of the layered structure and depending on the application.

When a DLC layer is deposited on top of the layered structure, the hardness and low-wear characteristics, typical for a DLC type coating prevail. This implies that by depositing a DLC layer on top of the layered structure a high wear and abrasion resistance coating is obtained. Thicknesses higher than these of conventional DLC coatings can be deposited in this way.

In the case a DLN coating is deposited as top layer, the layered structure is characterized by a low surface energy and by a low friction coefficient. Such a layered structure is in particular suitable as non-sticking coating.

According to a second aspect of the invention, a substrate covered at least partially with a layered structure as described above is provided.

A great advantage of the layered structure according to the present invention is the high corrosion protection that may be obtained because of the good surface coverage.

The surfaces of the substrate that are not coated or not coated well with the first intermediate coating because they are not exposed to the beam of atom(s) of group IVB, group VB or group VIB will be protected by the second intermediate layer and the diamond-like carbon layer.

According to a third aspect of the invention, the use of a substrate covered at least partially with a layered structure as described above for high impact and/or high shear applications is provided.

The substrate according to the present invention can be used for high impact and/or high shear applications because of the strong adhesion of the DLC coating to the substrate by means of the first and second intermediate layer.

The layered structure according to the present invention is for example suitable as coating for components for metal forming applications such as staking tools, punches, mandrels, necking dies for example used for aluminium can making.

The layered structure according to the invention is also suitable as coating for parts used for semiconductor chip manufacturing, metrology, lithography or testing equipment such as electrostatic chucks, wafer handlers, lift pins, precision alignment components, punches and tools used in electronic packaging and components used for wafer probing.

Furthermore the layered structure can be used as coating for blow molding components and components for textile machinery such as thread splits, bases, pins and cores; for engine components (as for example racing components) such as lifters, tappets, connecting rods and wrist pins; for neck rings used for plastic preforms.

Additionally, the layered structure according to the present invention is suitable for the protection of copper and nickel based alloys.

According to a further aspect of the invention, a method to cover a substrate with a layered structure is provided.

The method comprises the steps of
providing a substrate;
applying a first intermediate layer, said first intermediate layer comprising at least one element of group IVB, group VB or group VIB, such as titanium and/or chromium;
applying a second intermediate layer, said second intermediate layer comprising a diamond-like nanocomposite composition;
applying a diamond-like carbon layer.

If desired, the deposition of the first intermediate layer may be completely stopped before the application of the second intermediate layer. In this way a reproducible transition between the layers can be obtained.

DESCRIPTION OF THE PREFERRED EMBODIMENTS OF THE INVENTION

The characteristics of three different coating types are compared. The coating types are deposited on a hardened steel substrate.

The three coating types are subjected to a Rockwell adhesion test and to a scratch adhesion test.
 a) The first coating type comprises a layered structure of a DLN layer and a DLC layer deposited on top of this DLC layer;
 b) The second coating type comprises a layered structure of a titanium layer and a DLC layer deposited on top of this titanium layer. The composition of the titanium layer is gradually changed from a titanium layer to a DLC layer.
 c) The third coating type comprises a layered structure according to the present invention. This layered structure comprises a titanium layer, a DLN layer deposited on top of the titanium layer and a DLC layer deposited on top of the DLN layer. There is no gradient between the titanium and the DLN layer, whereas the DLN layer is gradually changing to a DLC layer.

The adhesion of the second and third coating type measured by means of the Rockwell C indentation test is better than the adhesion of the first coating type.

The HF value for the first coating type is HF 3-5. For the second coating type a HF value 1-3 is measured, whereas for the third coating type a HF value 1-3 is measured.

The critical load to obtain delamination in a scratch adhesion test is for the third coating type between 22 and 35 N. For the first coating type a critical load between 15 and 30 N is obtained; for the second coating type a critical load between 15 and 27 N is obtained.

Comparison of the scratch adhesion of the different coatings indicates that the third coating type gives the best $L_{c_2}$-values.

A coating of the first type does not perform well in high shear and high impact loading applications.

A coating of the second type performs slightly better under high impact loading. However, under high shear loading there is possibility of wear and coating removal.

A coating of the third type performs very well under both high impact and high shear applications.

A coating of the second type and a coating of the third type are compared in a high impact aluminum sheet metal forming application.

The coating of the third type provides an increased life time. Compared to the life time of a coating of the second time the life time of a coating of the third type is 3 to 4 times longer.

The invention claimed is:

1. A layered structure comprising:
   a first intermediate layer, said first intermediate layer consisting of a titanium based coating of at least one of Ti, TiC, TiN, and TiCN;
   a second intermediate layer deposited on top of said first intermediate layer, said second intermediate layer comprising a diamond-like nanocomposite composition; and
   a diamond-like carbon layer deposited on top of said second intermediate layer.

2. A layered structure according to claim 1, wherein said first intermediate layer consists of titanium.

3. A layered structure according to claim 1, wherein said structure further comprises at least a layer comprising a diamond-like nanocomposite composition on top of said diamond-like carbon layer.

4. A layered structure according to claim 1, wherein said first intermediate layer has a thickness between 0.001 and 1 μm.

5. A layered structure according to claim 1, wherein said second intermediate layer has a thickness of 0.01 to 5 μm.

6. A layered structure according to claim 1, wherein said diamond-like carbon layer has a thickness between 0.1 and 10 μm.

7. A layered structure according to claim 1, wherein said nanocomposite composition comprises in proportion to the sum of C, Si, and O in at % 40 to 90% C, 5 to 40% Si, and 5 to 25% O.

8. A layered structure according to claim 1, wherein said second intermediate layer comprises a metal doped diamond-like nanocomposite composition.

9. A layered structure according to claim 1, wherein said diamond-like carbon layer is doped with a metal.

10. An article of manufacture, comprising:
    a substrate covered at least partially with a layered structure according to claim 1.

11. A method to cover a substrate with a layered structure, said method comprising the steps of
    providing a substrate;
    applying a first intermediate layer, said first intermediate layer comprising consisting of a titanium based coating of at least one of Ti, TiC, TiN, and TiCN;
    applying a second intermediate layer, said second intermediate layer comprising a diamond-like nanocomposite composition; and
    applying a diamond-like carbon layer to obtain a layered structure according to claim 1.

12. A layered structure comprising:
    a first intermediate layer, said first intermediate layer consisting essentially of a titanium based coating of at least one of Ti, TiC, TiN, and TiCN;
    a second intermediate layer deposited on top of said first intermediate layer, said second intermediate layer comprising a diamond-like nanocomposite composition; and
    a diamond-like carbon layer deposited on top of said second intermediate layer.

13. A layered structure comprising:
    a first intermediate layer consisting of a titanium based coating;
    a second intermediate layer deposited on top of said first intermediate layer, said second intermediate layer comprising a diamond-like nanocomposite composition; and
    a diamond-like carbon layer deposited on top of said second intermediate layer.

14. A layered structure according to claim 13, wherein said layered structure is configured for use in a high impact and/or high shear application.

* * * * *